(12) United States Patent
Wen et al.

(10) Patent No.: US 11,888,492 B2
(45) Date of Patent: Jan. 30, 2024

(54) BACKGROUND OFFSET CALIBRATION OF A HIGH-SPEED ANALOG SIGNAL COMPARATOR

(71) Applicant: CIRRUS LOGIC INTERNATIONAL SEMICONDUCTOR LTD., Edinburgh (GB)

(72) Inventors: Jianping Wen, Austin, TX (US); John L. Melanson, Austin, TX (US)

(73) Assignee: CIRRUS LOGIC, INC., Austin, TX (US)

( * ) Notice: Subject to any disclaimer, the term of this patent is extended or adjusted under 35 U.S.C. 154(b) by 158 days.

(21) Appl. No.: 17/683,650

(22) Filed: Mar. 1, 2022

(65) Prior Publication Data

US 2023/0283286 A1   Sep. 7, 2023

(51) Int. Cl.
 *H03M 1/06* (2006.01)

(52) U.S. Cl.
 CPC ............................... *H03M 1/0607* (2013.01)

(58) Field of Classification Search
 CPC ...... H03M 1/06; H03M 1/1023; H03M 1/462; H03M 1/0607
 See application file for complete search history.

(56) References Cited

U.S. PATENT DOCUMENTS

| | | | | |
|---|---|---|---|---|
| 6,084,538 A * | 7/2000 | Kostelnik | ........... | H03M 1/1023 341/120 |
| 7,466,249 B2 * | 12/2008 | Chen | .................. | H03M 1/1019 341/118 |
| 7,636,013 B2 * | 12/2009 | Bach | .................... | H03G 3/3036 330/9 |
| 8,258,991 B2 * | 9/2012 | Janakiraman | ........ | H03K 5/2481 341/172 |
| 8,723,706 B1 * | 5/2014 | Shin | ..................... | H03M 1/1019 341/161 |
| 8,773,294 B2 * | 7/2014 | Kosic | .................. | H03M 1/1023 341/161 |
| 8,957,794 B2 * | 2/2015 | Verbruggen | ............ | H03M 1/06 341/120 |
| 10,348,319 B1 * | 7/2019 | Monangi | ................. | H03M 1/08 |
| 10,516,411 B1 * | 12/2019 | Monangi | ................. | H03M 1/68 |
| 10,720,933 B2 | 7/2020 | Li | | |

(Continued)

*Primary Examiner* — Lam T Mai
(74) *Attorney, Agent, or Firm* — Mitch Harris, Atty at Law, LLC; Andrew M. Harris

(57) ABSTRACT

A background offset calibration system for an analog signal comparator provides low offset without compromising tracking bandwidth. The comparator includes a preamplifier and a decision latch. A switching selectively couples outputs of an analog circuit to the inputs of the preamplifier stage. A state control logic alternatively operates the system in a first phase in which the analog circuit acquires an input signal while the comparator is calibrated, and a second phase in which a comparison is performed by the comparator. In the first phase, the switching circuit disconnects the outputs of the analog circuit from the preamplifier stage and applies a common mode reference to the inputs of the preamplifier. An offset correction circuit determines correction changes from a history of states of the decision latch across multiple sampling cycles. The offset correction circuit adjusts a threshold voltage of the decision latch by applying the correction changes.

22 Claims, 12 Drawing Sheets

(56) References Cited

U.S. PATENT DOCUMENTS

| | | | |
|---|---|---|---|
| 2007/0132625 A1* | 6/2007 | Chen | H03M 1/0607 |
| | | | 341/155 |
| 2011/0304490 A1* | 12/2011 | Janakiraman | H03M 1/129 |
| | | | 327/365 |
| 2015/0091744 A1* | 4/2015 | Shen | H03M 1/0854 |
| | | | 341/110 |
| 2015/0162926 A1* | 6/2015 | Jung | H03M 1/002 |
| | | | 341/122 |

* cited by examiner

BACKGROUND OFFSET CALIBRATION OF A HIGH-SPEED ANALOG SIGNAL COMPARATOR

BACKGROUND

1. Field of Disclosure

The field of representative embodiments of this disclosure relates to calibration of high-speed comparators as used in analog-to-digital converters (ADCs) and digital-to-analog converters (DACs), and in particular to comparator auto-zero calibration systems and techniques.

2. Background

Analog signal comparators are in common use in data converters, e.g., ADCs and DACs, as well as in other signal acquisition and comparison systems. In particular, for low-power applications, successive-approximation registers are selected as a data converter of choice, because the fundamental active component of such converters is the comparator.

However, comparators suffer from variations in offset voltage due to random element mis-match, and in high-speed devices in particular, mis-match is very problematic due to small device areas employed in high-speed circuits. Solutions to the mis-match problem include conventional auto-zero (AZ) techniques, in which an offset-cancellation voltage is sampled onto capacitors in advance of conversion, and which is used to cancel the comparator offset during the comparator's decision phase. In conventional AZ techniques, the offset contributions from the comparator's output latch are not directly canceled, but are reduced by the gain of the preamplifier stage(s) preceding the latch, therefore a high gain preamplifier is typically required in order to reduce comparator offset variation to required levels. However, as the preamplifier gain is raised, the tracking bandwidth of the converter is correspondingly reduced.

Therefore, it would be advantageous to provide a method and system for calibrating a high-speed comparator to remove offset that does not require increasing preamplifier gain of the comparator.

SUMMARY

Improved offset reduction is accomplished in comparators and comparator calibration systems, integrated circuits including the comparators and comparator calibration systems, and their methods of operation.

The comparators and comparator calibration systems include an analog circuit, an analog signal comparator that compares outputs of the analog circuit, a switching circuit that selectively couples outputs of the analog circuit to inputs of a preamplifier stage of the analog signal comparator, a state control logic, and an offset correction circuit. The analog signal comparator includes the preamplifier stage and a decision latch that samples an output of the preamplifier stage to generate an output state of the analog signal comparator. The state control logic alternatively operates the system in a first phase in which the analog circuit acquires an input signal and the analog signal comparator is being calibrated, and a second phase in which an output of the analog circuit is compared by the analog signal comparator. A sampling cycle includes operating the system in the first phase and then the second phase. In the first phase, the state control logic controls the switching circuit to disconnect the outputs of the analog circuit from the inputs of the preamplifier stage of the analog signal comparator and the switching circuit applies a common mode reference to the inputs of the preamplifier stage of the analog signal comparator. The offset correction circuit determines an offset correction change dependent on a history of states of an output of the decision latch across multiple sampling cycles of the system. An output of the offset correction circuit is coupled to an offset input of the decision latch of the analog signal comparator to adjust a threshold voltage of the decision latch in conformity with the history of the states of the output of the decision latch.

The summary above is provided for brief explanation and does not restrict the scope of the claims. The description below sets forth example embodiments according to this disclosure. Further embodiments and implementations will be apparent to those having ordinary skill in the art. Persons having ordinary skill in the art will recognize that various equivalent techniques may be applied in lieu of, or in conjunction with, the embodiments discussed below, and all such equivalents are encompassed by the present disclosure.

DETAILED DESCRIPTION OF ILLUSTRATIVE EMBODIMENT

The present disclosure encompasses circuits and integrated circuits that include background-calibrated comparators. The systems may include an analog circuit, an analog signal comparator that compares outputs of the analog circuit, a switching circuit that selectively couples outputs of the analog circuit to inputs of a preamplifier stage of the analog signal comparator, a state control logic, and an offset correction circuit. The analog signal comparator includes the preamplifier stage and a decision latch that samples an output of the preamplifier stage to generate an output state of the analog signal comparator. The state control logic may operate the system in alternation between a first phase in which the analog circuit acquires an input signal and the analog signal comparator is being calibrated, and a second phase in which an output of the analog circuit is compared by the analog signal comparator.

Figure 1A:
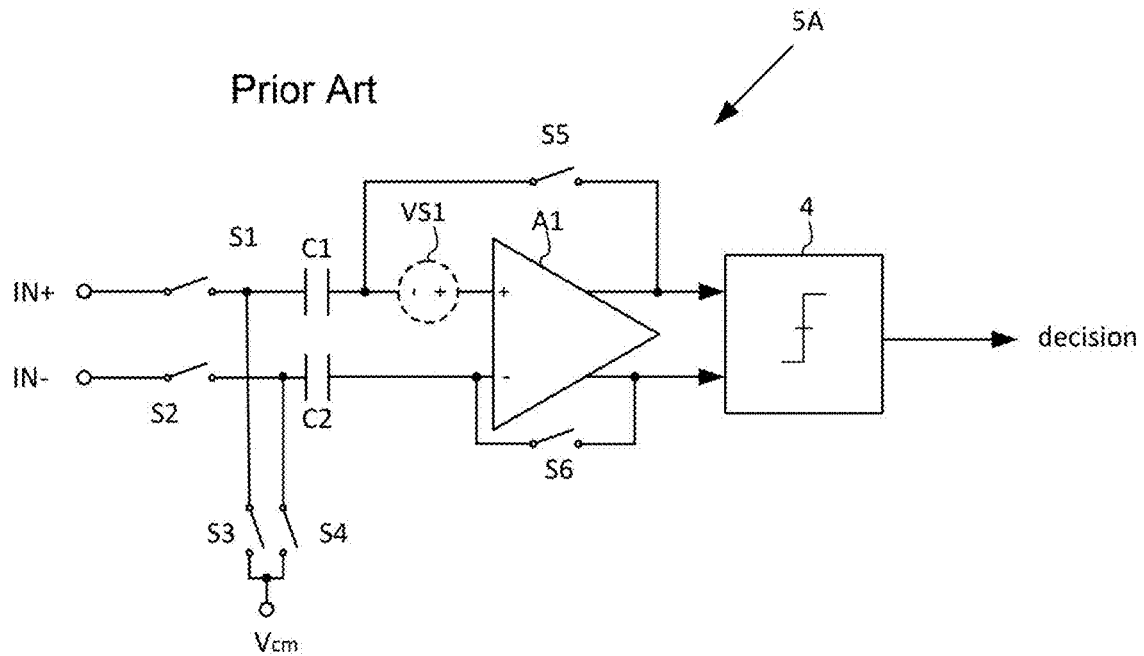
FIG. 1A is a simplified schematic diagram illustrating an example topology of a prior art closed-loop auto-zero comparator circuit 5A.

FIG. 1A is a simplified schematic diagram illustrating an example topology of a prior art closed-loop auto-zero comparator circuit 5A. A pair of switches S1, S2 are used to selectively couple a differential input signal IN+, IN− to the comparator circuit 5A, in which a preamplifier circuit A1 has outputs coupled to inputs of a latch 4, which provides a comparator decision output signal decision as a binary value, depending on a polarity of differential input signal IN+, IN−. Switches S1, S2 are closed during evaluation of differential input signal IN+, IN− and coupled to inputs of preamplifier circuit A1 through a pair of capacitors C1, C2 that hold an offset voltage obtained from a previous auto-zero operation to cancel offset of comparator circuit 5A. During the auto-zero operation, switches S1, S2 are opened to isolate comparator circuit 5A from differential input signal IN+, IN− and a pair of switches S3, S4 are closed to apply a common mode reference voltage $V_{cm}$ to the inputs of preamplifier circuit A1 and another pair of switches S5, S6 are closed, which causes capacitors C1 and C2 to store an error charge that cancels the comparator offset represented by voltage source VS1, which is not an actual component of the circuit. The offset error is reduced by the open loop gain of preamplifier A1, which requires a stable closed-loop response during autozeroing that places a limit on the speed of comparator circuit 5A, especially when the gain of preamplifier A1 is large.

Figure 1B:
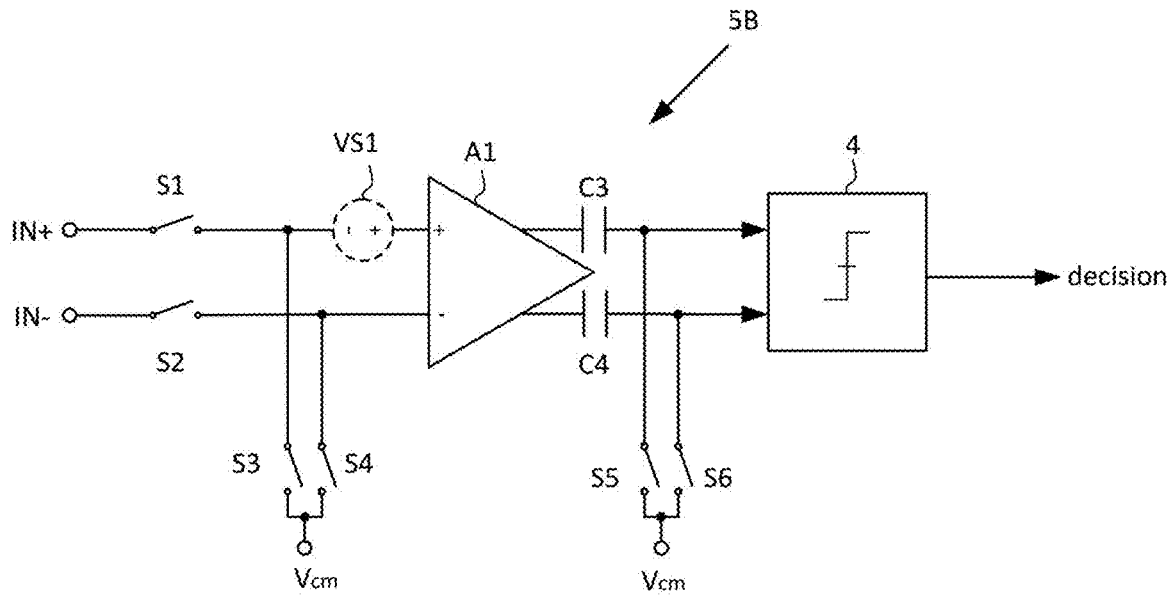
FIG. 1B is a simplified schematic diagram illustrating an example topology of a prior art open-loop auto-zero comparator circuit 5B.

FIG. 1B is a simplified schematic diagram illustrating an example topology of a prior art open-loop comparator circuit 5B. Comparator circuit 5B is similar to comparator 5A of FIG. 1A, so only differences between them are described below. Rather than reducing the gain of preamplifier A1 to unity via switches S5, S6 in comparator 5A, during autozeroing of comparator 5B, preamplifier A1 is operated open-loop, and the offset error charge of preamplifier A1 is stored on a pair of capacitors C3 and C4. The outputs of preamplifier A1 are coupled to latch 4 by capacitors C3, C4 during normal operation of comparator 5B, so that the offset of comparator 4 is canceled by an error charge stored on capacitors C3, C4 during the auto-zero operation. The open-loop topology of comparator 5B avoids the stability requirement imposed on comparator 5A. However, the open-loop gain of amplifier A1 must be low enough to avoid output saturation of amplifier A1 from offset during auto-zeroing. Therefore, several low gain preamplifier stages are frequently cascaded in open-loop comparator topologies, in order to suppress the offset due to latch 4, which could otherwise cause saturation of a high-gain preamplifier. However, the additional preamplifier stages each require capacitors to store their associated offset error, and the resultant chain of auto-zero capacitors and preamplifier stages reduce the overall speed of the comparator Also, the presence of capacitors C3, C4, and additional capacitors that would be required between multiple low-gain preamplifier stage, has an adverse effect on the speed comparator 5B.

Figure 2A:
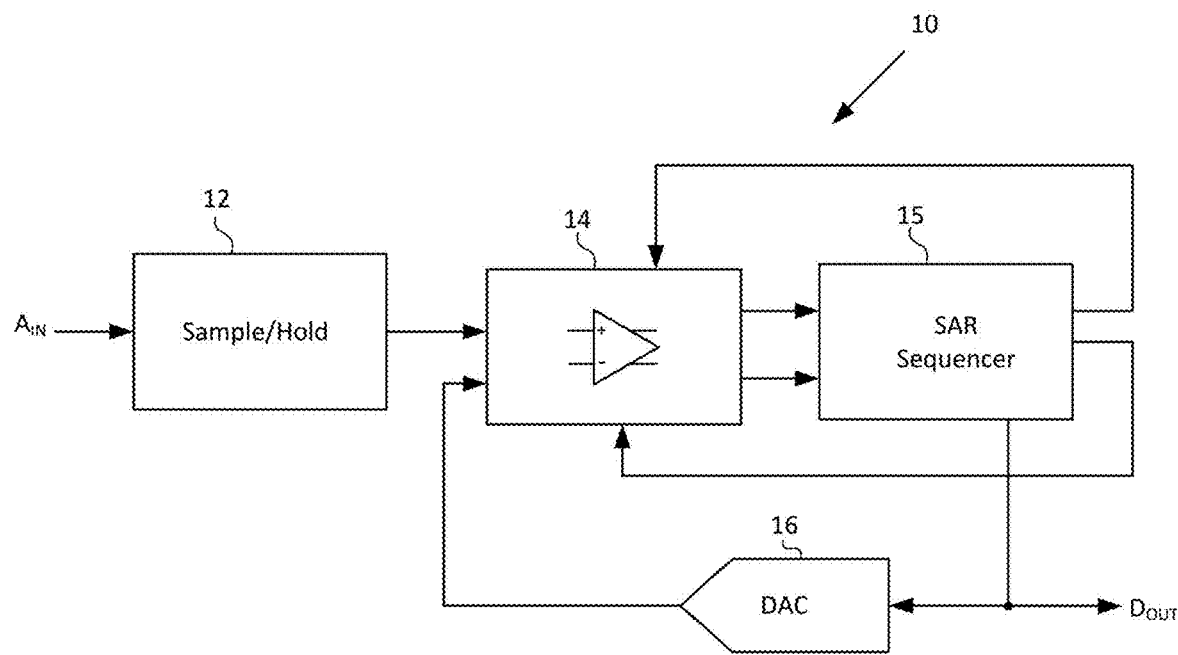
FIG. 2A is a block diagram illustrating an example successive approximation register (SAR) analog-to-digital converter (ADC) 10 and FIG. 2B shows an example cycle timing diagram 11 illustrating operation of example SAR ADC 10 of FIG. 2A, in accordance with an embodiment of the disclosure.
Figure 2B:
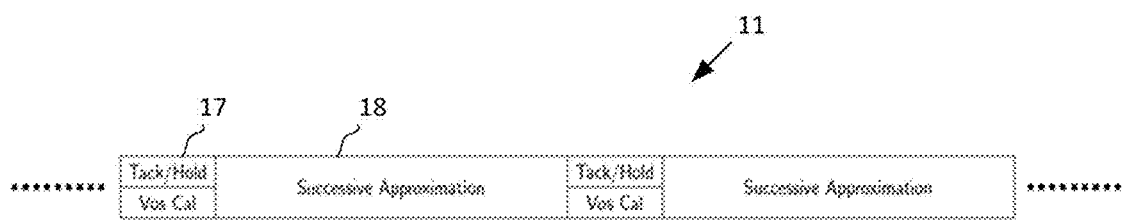

Referring now to FIG. 2A, a block diagram illustrating an example successive approximation register (SAR) analog-to-digital converter (ACD) 10 is shown, in accordance with an embodiment of the disclosure. An input signal $A_{IN}$ is sampled and held by a sample/hold block 12 and, during an evaluation phase, converted to a digital output $D_{OUT}$ by a successive approximation process controlled by a SAR sequencer 15 that resolves digital output $D_{OUT}$ one bit at a time from a most-significant bit (MSB) to a least-significant bit (LSB). A digital-to-analog converter (DAC) 16 provides feedback of a present (approximated) value of digital output $D_{OUT}$ provided from SAR sequencer 15. A comparator 14 compares the output of DAC 16 to an input value provided from the output of sample/hold block 12. The evaluation phase terminates once the LSB is resolved, and another conversion cycle may begin. In accordance with an embodiment of the disclosure, SAR sequencer 15 interleaves calibration phases with evaluation phases, so that while sample/hold block 12 is acquiring input signal $A_{IN}$, offset cancelation internal to comparator 14 is calibrated. The above process provides a background calibration that may be applied to high-speed comparators, e.g., comparator 14, because offset contributions from both the internal preamplifier and internal latch of comparator 14 may be canceled at the same time, and no trade-off between preamplifier gain and comparator tracking bandwidth is required. Referring additionally to FIG. 2B, an example cycle timing diagram 11 illustrates the interleave of a comparator calibration phase 17 in which sample/hold block 12 tracks and holds input signal $A_{IN}$, while offset calibration is performed under control of SAR sequencer 15. After comparator calibration phase 17, an evaluation phase 18 occurs, during which SAR sequencer 15 performs successive approximation of the held value of $A_{IN}$ provided at the output of sample/hold block 12. Thus, comparator background offset calibration may be updated for every ADC sample, as shown in cycle timing diagram 11 of FIG. 2B. Alternatively, a lower rate of calibration cycles may be used if the calibration algorithm is implemented with a period of more than one sample per calibration cycle. While the above-described background calibration techniques are described with respect to the depicted SAR ADC 10 of FIG. 2A, the techniques may be applied to other systems in which extra calibration cycles may be allocated for comparator calibration among the evaluation decision cycles.

Figure 3A:
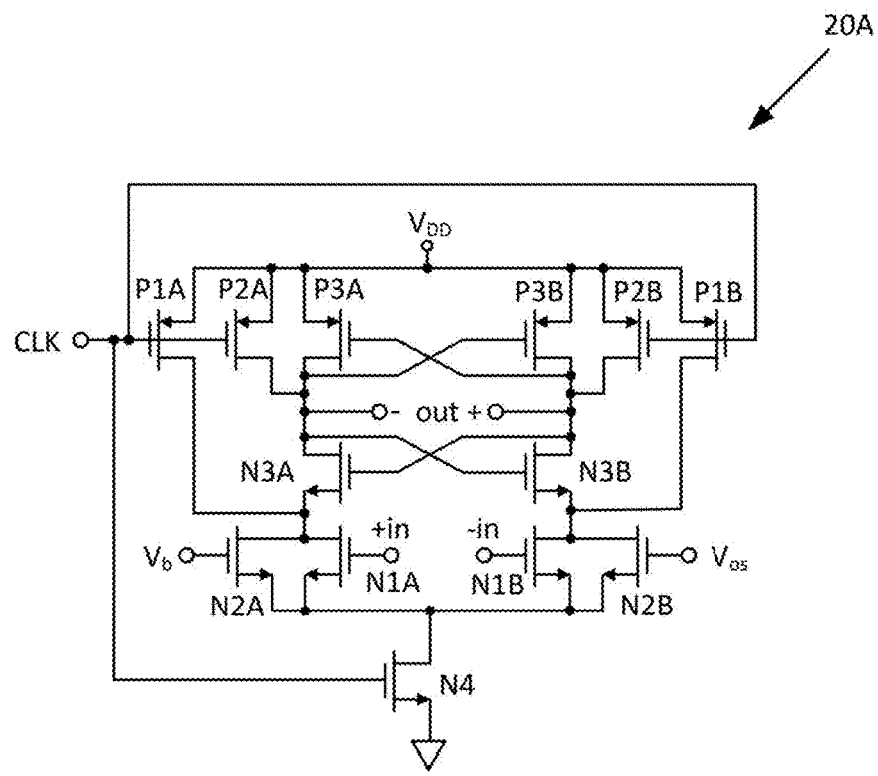
FIG. 3A is a schematic diagram of an example latch circuit 20A that may be used within comparator 14 in SAR ADC 10 of FIG. 2A, in accordance with an embodiment of the disclosure.

Referring now to FIG. 3A, a schematic diagram of an example latch circuit 20A that may be used within comparator 14 in SAR ADC 10 of FIG. 2 is shown, in accordance with an embodiment of the disclosure. Example latch circuit 20A has a structure similar to a conventional StrongARM latch, but includes additional inputs that control biasing and offset voltage in example latch circuit 20A. Example latch circuit 20A is formed by two transistor ladders that include pull-up transistors P1A, P2A, P3A and transistors P1B, P2B, P3B for each "arm" of example latch circuit 20A. A clock signal CLK controls conduction of a "tail" or "foot" transistor N4 and also pull-up transistors P1A, P1B, so that when clock signal CLK is raised to a logical high voltage state, e.g., 5 VDC, transistor N4 conducts to permit example latch 20A to evaluate the differential voltage of inputs +in, −in. Output pull-up transistors P3A, P3B are cross-coupled and a next pair of transistors N3A, N3B down in the ladders are cross-coupled, so that example latch 20A forms a fast bi-stable latch while transistor N4 is turned on, due to a high gain with respect to inputs +in, −in. Prior to clock signal CLK being asserted, clock signal CLK is in a logical low voltage state, e.g., 0 VDC. A pair of input transistors N1A, N1B receive inputs +in, −in and track the differential input voltage. When clock signal CLK is raised to the logical high voltage state, the instantaneous strobe current conducted through transistor N4 flows through both "arms" of example latch 20A, but with different strength, according to the difference between voltage at inputs +in, −in, which due to the positive feedback provided by the cross-coupled pairs of output pull-up transistors P3A, P3B and ladder transistors N3A, N3B, causes the state of output out of example latch 20A to settle to a saturated state determined by the polarity of the differential voltage between inputs +in, −in. Mismatches between transistors in example latch 20A, and other offsets in the comparator as described above, may be compensated-for by an offset adjustment provision in example latch 20A, in accordance with an embodiment of the disclosure. A transistor N2B receives an offset adjustment voltage $V_{os}$ and a transistor N2A receives a bias voltage $V_b$ that is generally set to the common mode voltage of inputs +in, −in, so that the operation of example latch 20A is offset-adjustable, by shifting the operating point of example latch 20A according to the provided offset adjustment voltage $V_{os}$ and bias voltage $V_b$, which will change the decision threshold of the above-described evaluation that occurs when tail transistor N4 is activated. Selection of the calibration rate of the background calibration techniques described herein may further be used to cancel 1/f noise of the transistors within example latch 20A and the preamplifier of comparator 14, for example, by selection of a calibration rate higher than twice the knee frequency of the 1/f noise characteristic. While example latch 20A provides an example of a latch circuit that may be used within comparator 14 of in SAR ADC 10 of FIG. 2, other type of latches may be employed and modified according to the above-described example, and such implementations are contemplated in accordance with other embodiments of the disclosure.

Figure 3B:
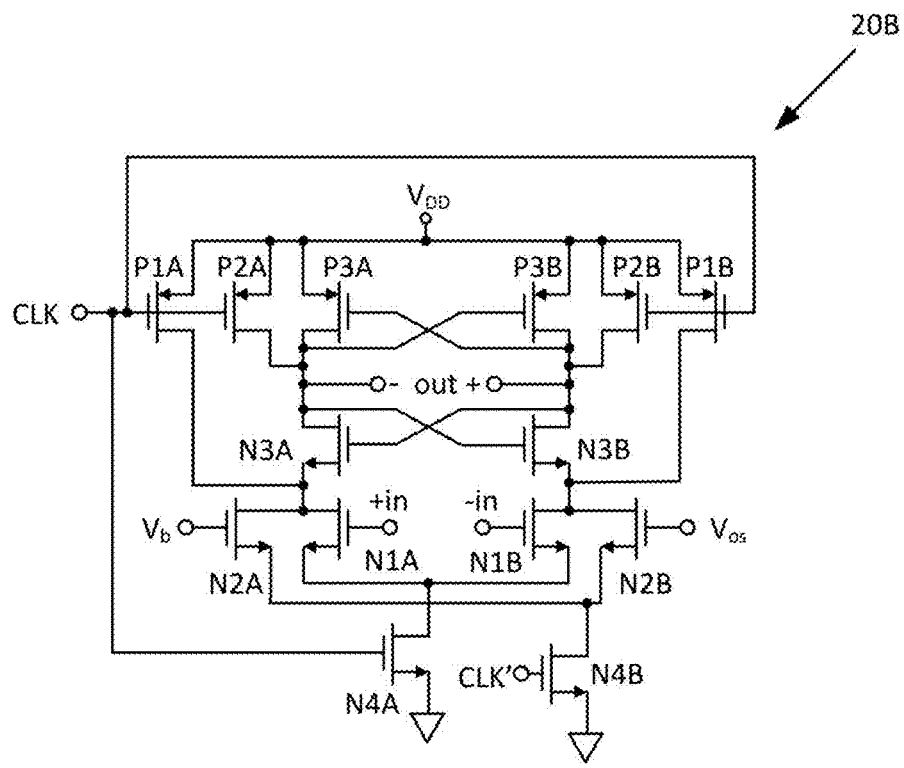
FIG. 3B is a schematic diagram of another example latch circuit 20B that may be used within comparator 14 in SAR ADC 10 of FIG. 2A, in accordance with another embodiment of the disclosure.

FIG. 3B is a schematic diagram of another example latch circuit 20B that may be used within comparator 14 in SAR ADC 10 of FIG. 2, in accordance with another embodiment of the disclosure. Example latch circuit 20B is similar to example latch circuit 20A of FIG. 3A, so only differences between them will be described in further detail below. Example latch circuit 20B includes multiple tail transistors N4A, N4B, rather than the single tail transistor N4 of example latch 20A. Tail transistor N4B controls whether current may be drawn through transistors N2A, N2B, which are the transistors that apply the offset adjustment voltage $V_{os}$ and bias voltage $V_b$ to shift the decision threshold of example latch 20B. A delayed or advanced clock signal CLK' controls the conduction of tail transistor N4B, which provides for time-domain control of the degree to which offset adjustment voltage $V_{os}$ affects the decision point, within a narrow range of delays that permit offset adjustment voltage $V_{os}$ and bias voltage $V_b$ to shift the decision threshold of example latch 20B, before the positive feedback provided by the cross-coupled pairs of output pull-up transistors P3A, P3B and ladder transistors N3A, N3B, has caused the state of output out of example latch 20A to settle. Clock signal CLK' may have a positive edge earlier or later than the positive edge of clock signal CLK, and the phase difference between clock signal CLK and clock signal CLK' will determine the effective offset adjustment introduced by offset adjustment voltage $V_{os}$ and bias voltage $V_b$. The phase difference between clock signal CLK and clock signal CLK' may be precisely controlled via digital logic, which provides direct digital control of the offset adjustment applied in example latch 20B. Time domain calibration and voltage domain calibration may be combined to form a flexible two-dimensional calibration algorithm based on the decision history of example comparator 20B, according to the offset calibration techniques disclosed herein.

Figure 4:
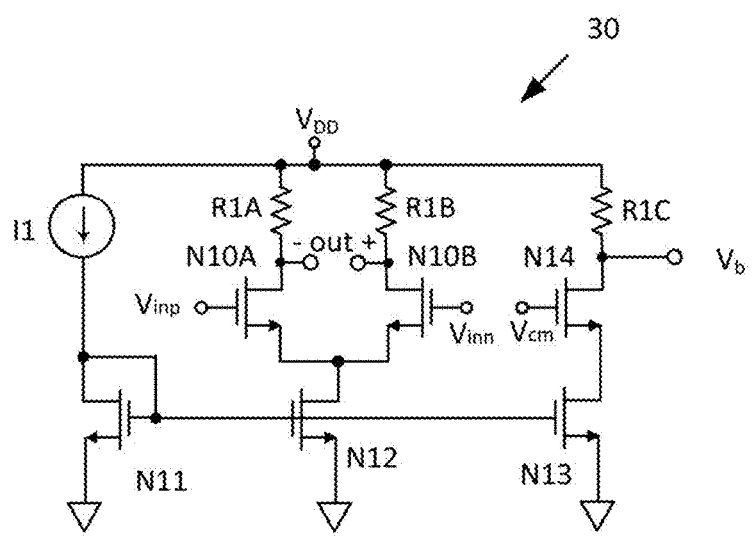
FIG. 4 is a schematic diagram of an example final stage 30 of an example preamplifier circuit that may be used within comparator 14 in SAR ADC 10 of FIG. 2A, in accordance with an embodiment of the disclosure.

Referring to FIG. 4, a schematic diagram of an example final stage 30 of an example preamplifier circuit that may be used within comparator 14 in SAR ADC 10 of FIG. 2 is shown, in accordance with an embodiment of the disclosure. A current source I1 sets a current level through a mirror transistor N11 that, in turn, sets the magnitude of the sum of the currents through a preamplifier output stage formed by transistors N10A, N10B that receive a differential input voltage $V_{inp}$, $V_{inn}$, and resistors RIA, RIB and a bias stage formed by transistor N14 and resistor R1C, by setting the current returned through transistors N12, N13. Bias voltage output $V_b$ is set by common-mode voltage input $V_{cm}$, which is set to the common mode voltage of differential input voltage $V_{inp}$, $V_{inn}$, so that bias voltage output $V_b$ is equal to the common-mode of differential output signal out and provides the common-mode input reference to example latches 20A, 20B as described above.

Figure 5:
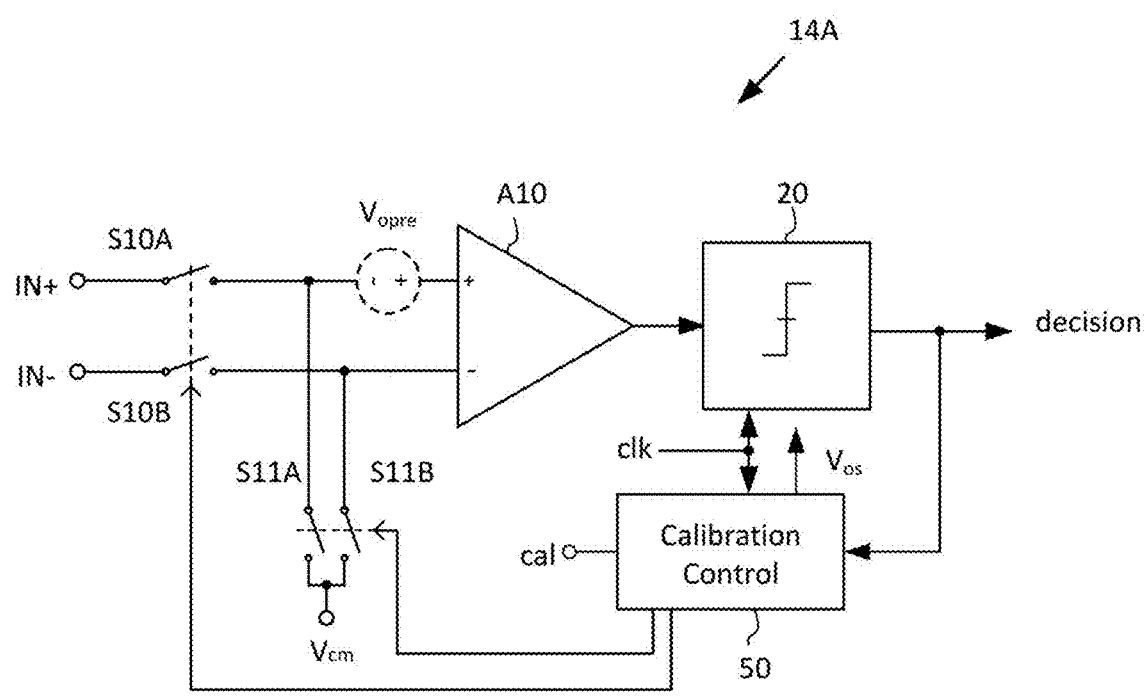
FIG. 5 is a block diagram of an example background-calibrated comparator circuit 14A that may be used to implement comparator 14 of FIG. 2A, in accordance with an embodiment of the disclosure.

Referring now to FIG. 5, a block diagram of an example background-calibrated comparator circuit 14A that may be used to implement comparator 14 of FIG. 2 is shown, in accordance with an embodiment of the disclosure. A pair of inputs IN+, IN− are coupled through a pair of switches S10A, S10B to a preamplifier A10. Another pair of switches S11A, S11B provide for applying common-mode voltage reference $V_{cm}$ to the inputs of preamplifier A10 during background calibration. A latch 20, which may be, for example, implanted by example latch 20A or example latch 20B as described above, receives the output of preamplifier 10 and provides a decision output decision in response to a clock signal clk provided from a calibration control block 50. Offset voltage $V_{opre}$ represents the total offset voltage of preamplifier A10, which is canceled along with the voltage offset of latch 20. Calibration control block 50 provides offset adjustment voltage $V_{os}$ to latch 20, which is determined in accordance with historical values of decision output decision over multiple calibration cycles, and which compensates for the total offset of preamplifier A10 and latch 20.

Figure 6:
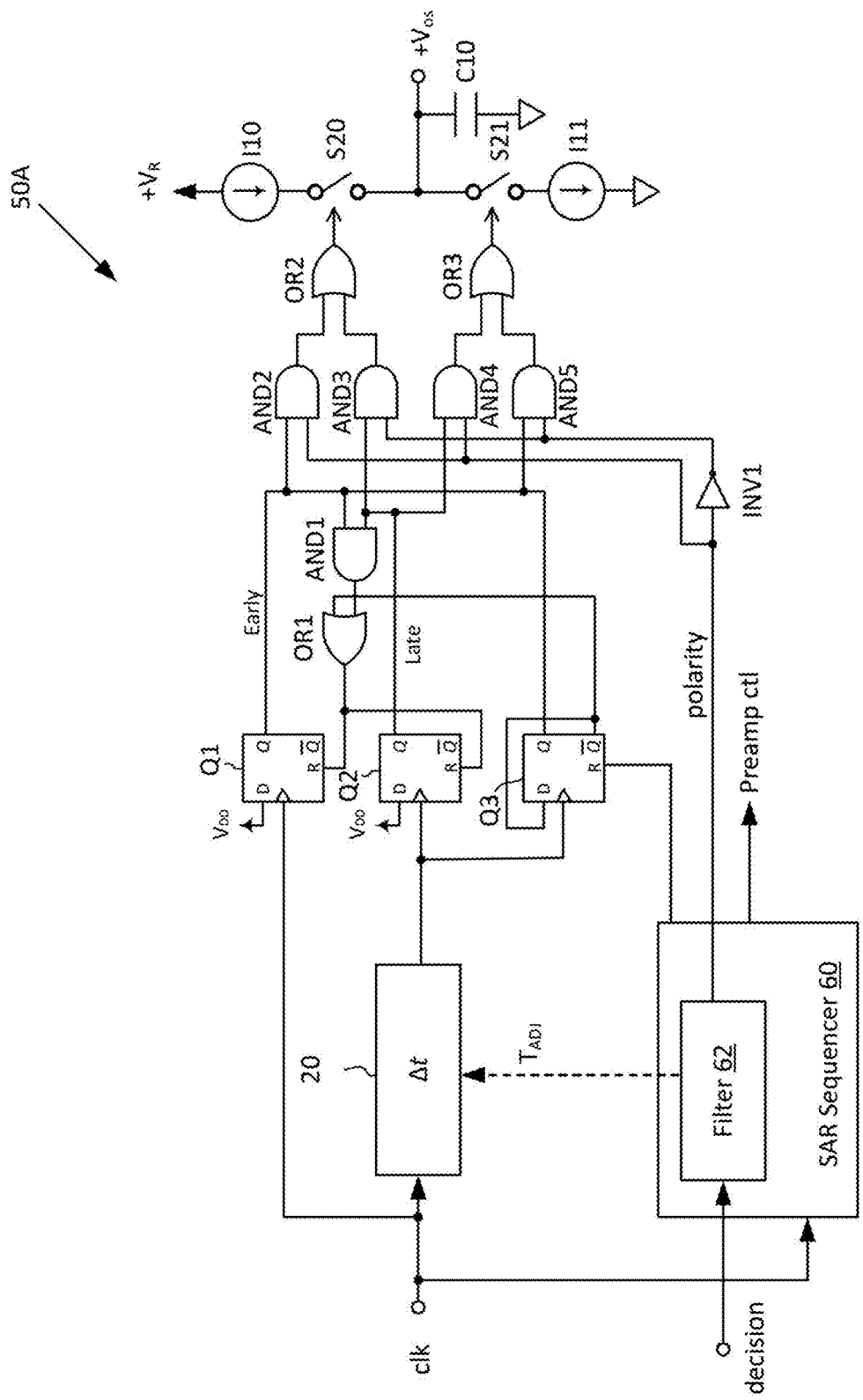
FIG. 6 is a block diagram of an example calibration control circuit 50A that may be used to implement calibration control circuit 50 in background-calibrated comparator circuit 14A of FIG. 5, in accordance with an embodiment of the disclosure.

Referring now to FIG. 6, a schematic diagram of an example calibration control circuit 50A that may be used to implement calibration control circuit 50 in background-calibrated comparator circuit 14A of FIG. 5, in accordance with an embodiment of the disclosure. A SAR sequencer 60 controls operation of the background calibration process, and may include other control signals for operation of a SAR ADC, such as example SAR ADC 10 of FIG. 2, or for controlling another type of converter or other circuit, and which also may be located external to calibration control circuit 50A, in accordance with other embodiments of the disclosure. A clock signal clk is introduced to a pair of D-latches Q1, Q2, with a delayed version of clock signal clk provided by the output of a delay circuit 20. A third D-latch Q3 is configured to toggle at each assertion of clock signal clk. A logic circuit formed by a logical-AND gate AND1 and a logical-OR gate OR1, provide a reset signal to reset D-latches Q1, Q2, after the leading edge of the delayed version of clock signal clk has caused D-latch Q2 to toggle, asserting a logic signal Late, which occurs after the leading edge of clock signal clk has caused D-latch Q1 to be set, asserting a logic signal Early. D-latches are also reset during every other cycle of clock signal clk when the output of D-latch Q3 is in a logical high state, so that calibration control circuit 50A updates an offset adjustment voltage $+V_{os}$, during, for example, the track/hold phase of SAR ADC 10. A set of logical-AND gates AND2-AND5, a pair of logical-OR gates OR2, OR3, and an inverter INV1, form a multiplexer that selects one of logic signal Early or logic signal Late to control a positive charge pump switch S20, and the other one of logic signal Early or logic signal Late to control a negative charge pump switch S21, according to a control signal polarity provided by SAR sequencer 60. A current source I10 and a current source I11, provide current pulses of positive or negative polarity, respectively, when switch S20 or switch S21 is activated, which cause incremental changes in offset adjustment voltage $+V_{os}$, which is held by a capacitor C10. A control signal Preamp ctl configures the preamplifier of the comparator being calibrated, for example by operating switches S10A, S10B, S11A and S11B of comparator 14A of FIG. 5, to force the inputs of the preamplifier to common-mode voltage $V_{cm}$ during calibration. The operation of example calibration control circuit 50A produces a pulse at every calibration cycle, which has a polarity as determined by a logical circuit or micro-program within SAR sequencer that, in the depicted embodiment, implements a filter 62 that accumulates decisions provided from the output of the comparator as input signal decision to SAR sequencer 60 over multiple calibration cycles to determine control signal polarity, which, in turn, determines the direction in which the charge pump updates offset adjustment voltage $+V_{os}$. The width of the pulses is determined by a time delay Δt of delay circuit 20, which may be a fixed time delay, or may be a variable time delay controlled by a control value $T_{ADJ}$ provided from SAR sequencer 60 to alter the rate of change of offset adjustment voltage $+V_{os}$ according to the decision history accumulated by filter 62. Filter 62 may be a digital finite impulse response (FIR) filter that processes the comparator decision history, which may then be used to control the active time of the charge pump by adjusting control value $T_{ADJ}$. The selection of a response for filter 62 may be flexible, within the constraint that the calibration control loop remains stable, and an optimized FIR response may minimize the initial transient introduced by the calibration intervals. An example FIR response may be a simple moving average of calibration decisions, and the active time Δt of the charge pump may have finite steps that may be determined based on a moving average output of filter 62. When offset adjustment voltage $V_{os}$ converges to a final target voltage, the moving average output of filter 62 may be, for example 0.5, and active time Δt may be at a minimum in order to minimize ripple in offset adjustment voltage $V_{os}$ after the calibration loop has settled to a proper offset compensation value. When the deviation of the output of filter 62 from the target midpoint value of 0.5 is significant, a longer active time Δt may be used to reduce the settling time of the calibration loop response. The control of control value $T_{ADJ}$ may be flexible and may include whatever resolution is desired, but generally a 2-bit adjustment (4-value range) may be sufficient. As an alternative to the FIR filter example described above, filter 62 may be implemented with a fast-Fourier transform (FFT) that allows analysis in the frequency domain to compute the offset adjustment voltage $V_{os}$ across multiple cycles, with unequal weighting applied to the terms at different samples of the FFT to emphasize samples nearer in time to the present calibration interval. Similarly, the FIR filter may have tap coefficients weighted in a similar manner.

Figure 7:
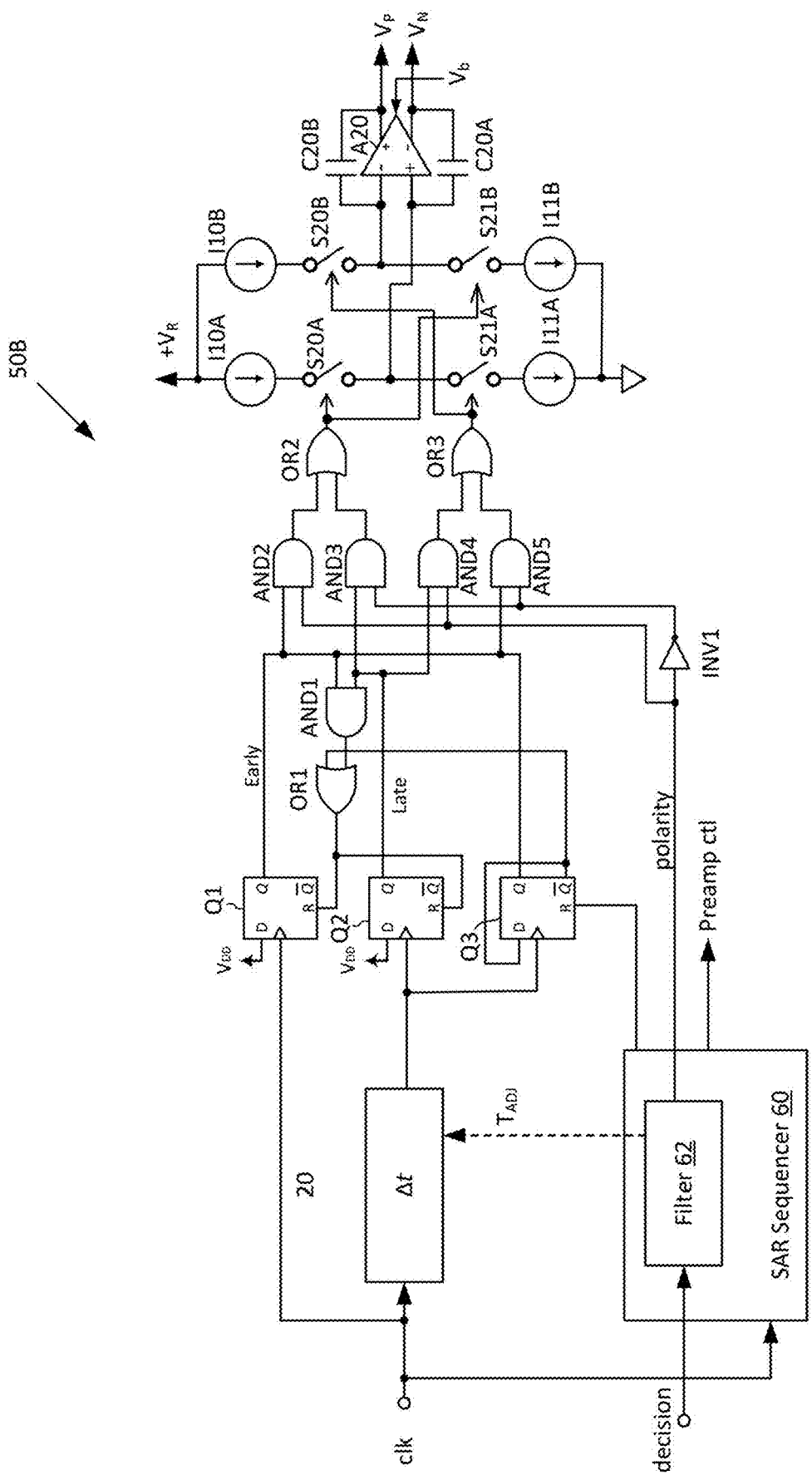
FIG. 7 is a block diagram of another example calibration control circuit 50B that may be used to implement calibration control circuit 50 in background-calibrated comparator circuit 14A of FIG. 5, in accordance with another embodiment of the disclosure.

Referring now to FIG. 7, a block diagram of another example calibration control circuit 50B that may be used to implement calibration control circuit 50 in background-calibrated comparator circuit 14A of FIG. 5 is shown, in accordance with another embodiment of the disclosure. Example calibration control circuit 50B is similar to example calibration control circuit 50A of FIG. 6, so only differences between them will be described below. In comparator implementations using calibration control circuit 50A of FIG. 6, offset adjustment voltage $+V_{os}$ provided at the output of calibration control circuit 50A may vary with respect to the bias voltage at the preamplifier and latch, e.g., bias voltage $V_b$ applied to example latch 20A or 20B of FIG. 3A or FIG. 3B, respectively from the bias output of preamplifier 30 of FIG. 4, which is dependent on the symmetry of the power supply voltage, and thus degrades the common-mode rejection ratio (CMRR) of the comparator. The common-mode voltage variation results in an observable comparator noise across calibration cycles, as offset adjustment voltage $+V_{os}$ is continually adjusted to compensate for the variation of bias voltage $V_b$, and the ability to track the variation is limited by the offset adjustment rate and the bandwidth of filter 62. Example calibration control circuit 50B provides insensitivity to common-mode voltage variation by providing symmetric control of a differential offset adjustment voltage $V_P$, $V_N$ that replace the common-mode bias voltage $V_b$ and offset adjustment voltage $V_{os}$ that were supplied, for example to example latch circuit 20A of FIG. 3A and example latch circuit 20B of FIG. 3B. In example calibration control circuit 50B, the charge pump output is determined from two pairs of current sources I10A, I11A and I10B, I11B, that are applied by corresponding pairs of switches S20A, S21A and S20B, S21B to charge corresponding output capacitors C20A, C20B, that form feedback paths of a fully-differential amplifier A20 that provides differential offset adjustment voltage $V_P$, $V_N$, with a common mode voltage controlled by bias voltage $V_b$ resulting in $V_b=(V_P+V_N)/2$, which is set to the common-mode voltage applied to the preamplifier of the comparator during calibration.

Figure 8:
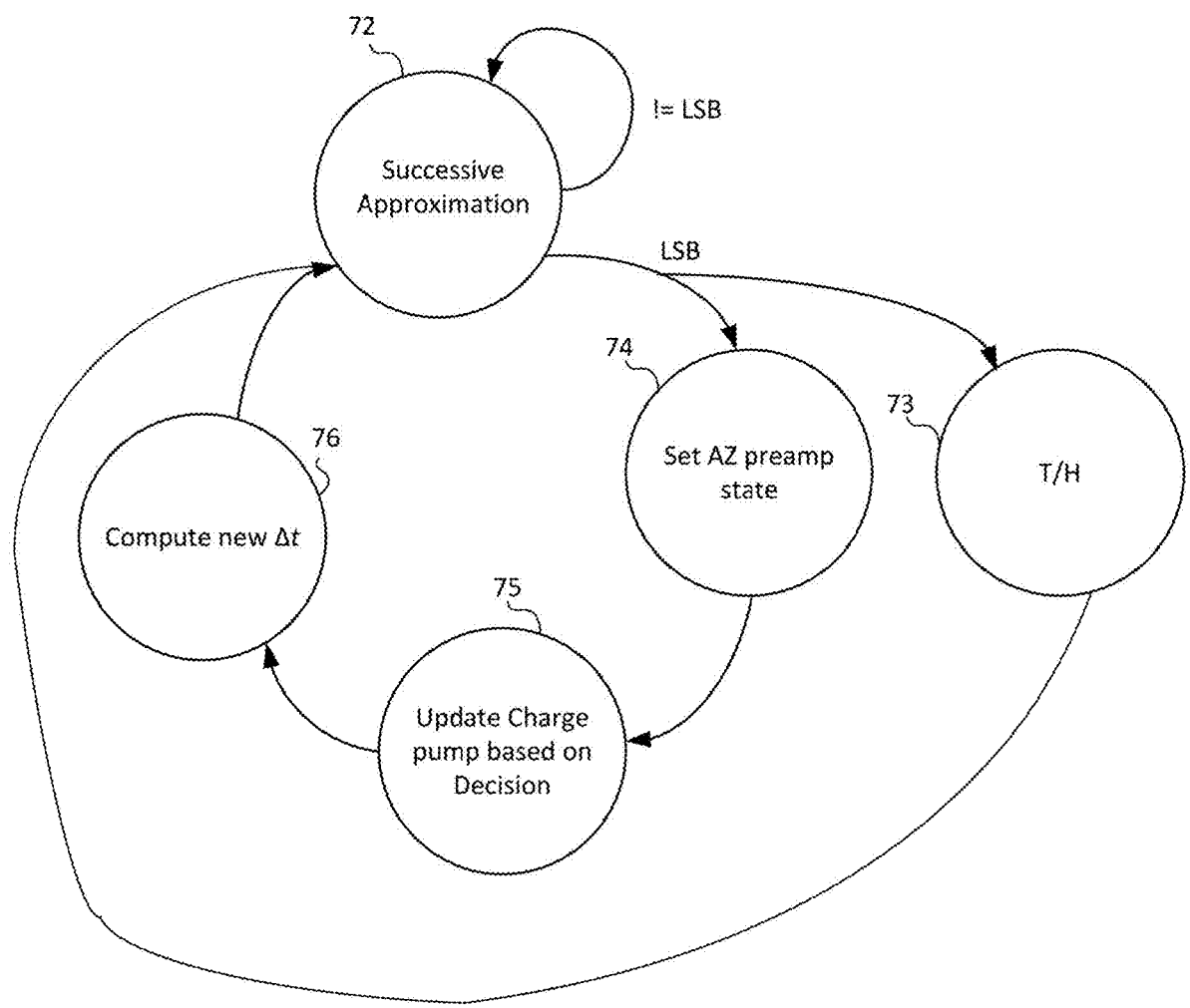
FIG. 8 is an example state diagram illustrating an example operation SAR sequencer 15 in SAR ADC 10 of FIG. 2A, in accordance with an embodiment of the disclosure.

Referring now to FIG. 8, an example state diagram illustrating an example operation of SAR sequencer 15 in SAR ADC 10 of FIG. 2 is shown, in accordance with an embodiment of the disclosure. During an evaluation phase 72, SAR sequencer 15 determines the bits of digital output value $D_{OUT}$ until the LSB has been evaluated. Then, the auto-zero pre-amplifier (preamp) state is set (state 74), i.e., the preamplifier inputs are disconnected from sample/hold block 12 and connected to common-mode voltage reference $V_{CM}$, while at the same time, sample/hold block 12 is set to acquire analog input signal $A_{IN}$ in a track/hold (T/H) operation 73. While the T/H operation is proceeding, the charge pump within SAR sequencer 15 is updated based on the decision output of comparator 14 (state 75), and the active time Δt of the charge pump is updated (state 76).

Figure 9:
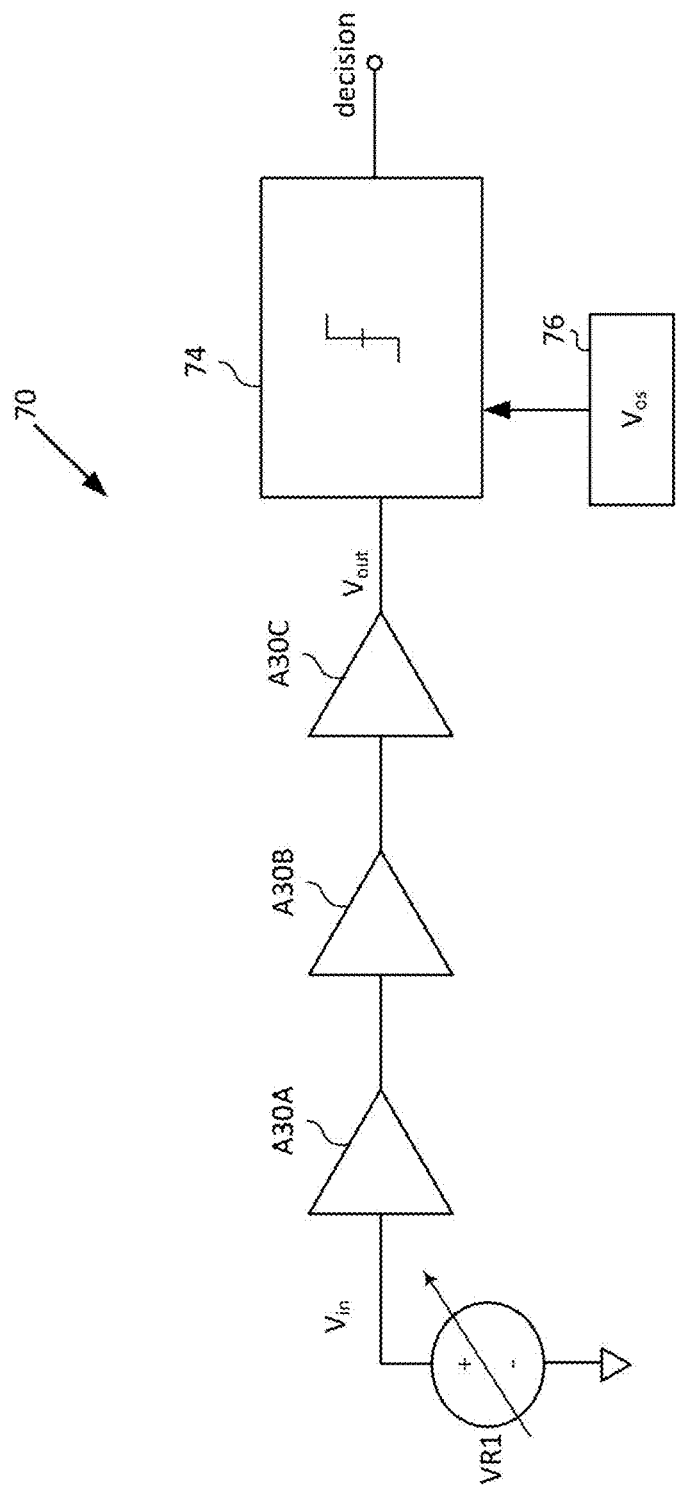
FIG. 9 is a block diagram of an example built-in self-test (BIST) circuit 70, in accordance with an embodiment of the disclosure.

Referring now to FIG. 9, a block diagram of an example built-in self-test (BIST) circuit 70 is shown, in accordance with an embodiment of the disclosure. While the above-described and illustrated examples are generally directed to ADCs and specifically SAR ADCs, the techniques disclosed herein may be applied in other systems and circuits. Example BIST circuit 70 provides an example of a BIST architecture for use in analog circuitry and that may be used to identify offset contributions of different components in a signal chain. A modification is provided to control offset adjustment voltage $V_{os}$ digitally from a digitally-controlled reference voltage source or DAC 76, rather than from a loop-controlled charge pump as in the above-described SAR converters. An input voltage is provided from an adjustable input reference voltage source VR1, which is provided to a comparator 74 through a plurality of cascaded analog stages, illustrated as amplifiers A30A, A30B and A30C, which all have the capability of implementing a chopper-stabilized amplifier stage. BIST circuit 70 is calibrated by setting adjustable input reference voltage source VR1 to zero and enabling chopping for all of amplifiers A30A, A30B and A30C, so that the individual offsets of amplifiers A30A, A30B and A30C do not appear in output voltage VOUT. Then, offset inherent in each of amplifiers A30A, A30B and A30C may be identified by disabling chopping individually for each of amplifiers A30A, A30B and A30C, which allows the individual offsets of amplifiers A30A, A30B and A30C to individually appear in the resulting decision output decision. The digitally-controlled offset voltage $V_{os}$ provided by DAC 76 is digitally swept and a digital code $D_o$ is determined from decision output decision, such that the density of logical "1" (or logical "0") values is at 50% of the total count. The resulting $D_o$ value is the offset contribution from comparator 74, when input voltage Vin=0. Next, input voltage Vin is swept and digital codes at 50% density are obtained by varying to obtain a mapping of the offset of comparator 74 vs input voltage Vin, which may be expressed as a slope k around the zero-referenced $D_o$ value. A linear region over which slope k is valid may be determined by sweeping input voltage Vin until the decision count saturates at 100% and 0%, which is the range of referred offset that may be measured by example BIST circuit 70. The comparator offset referred back to the input may be calculated as $-(D_o/k)$. Finally, the individual ones of amplifiers A30A, A30B and A30C are offset-observed by turning off chopping action around the selected one of amplifiers A30A, A30B and A30C, and determining digital codes $D_N$ where the output density of decision output decision is a 50%, where N is the index of the amplifier being evaluated, i.e., the amplifier for which chopping is disabled and the input-referred offset contributed by each amplifier N may then be found from $(D_N-D_o)/k$.

Figure 10:
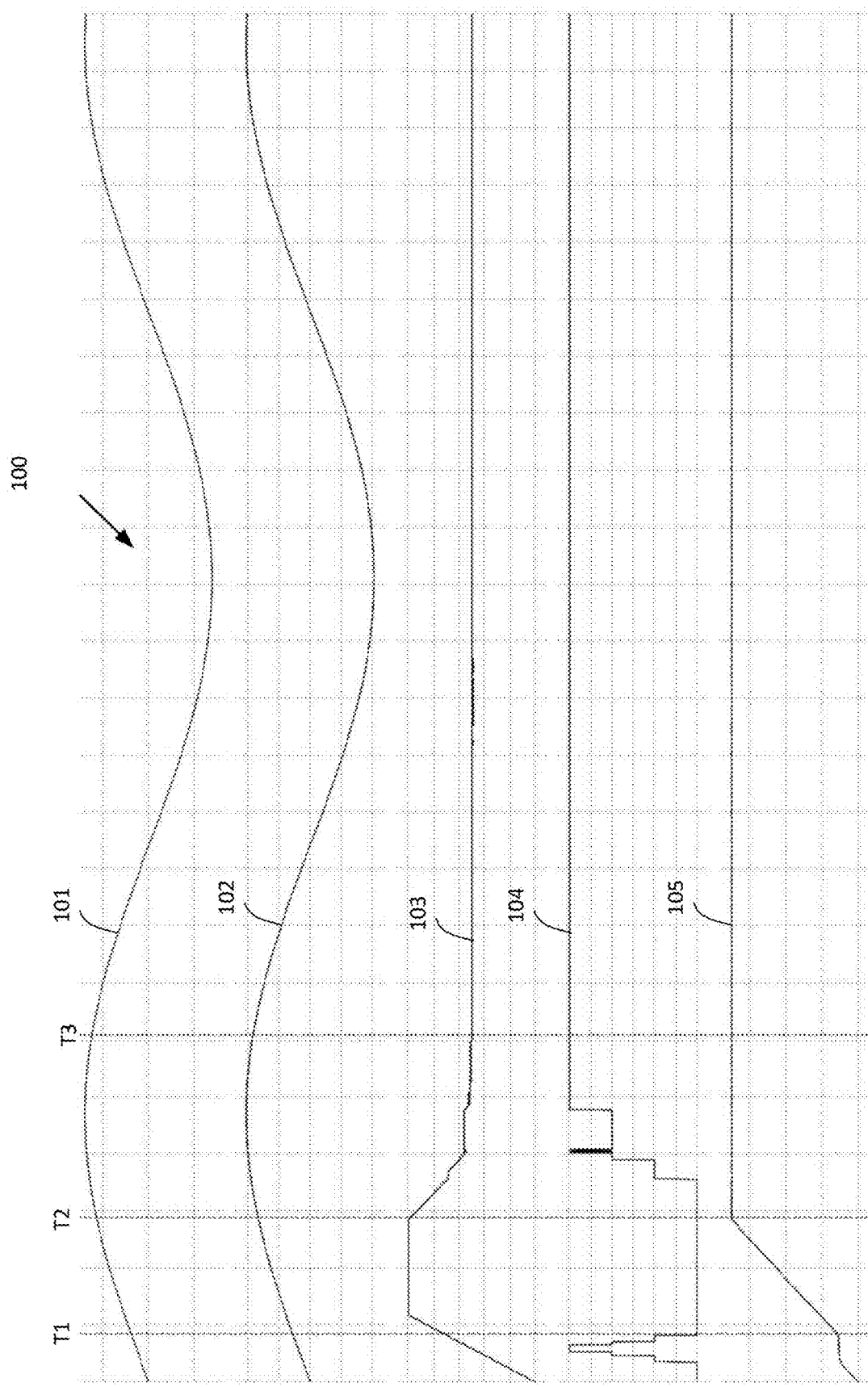
FIGS. 10-12 are example graphs illustrating operation and performance of SAR ADC 10 of FIG. 2A, in accordance with an embodiment of the disclosure.
Figure 11:
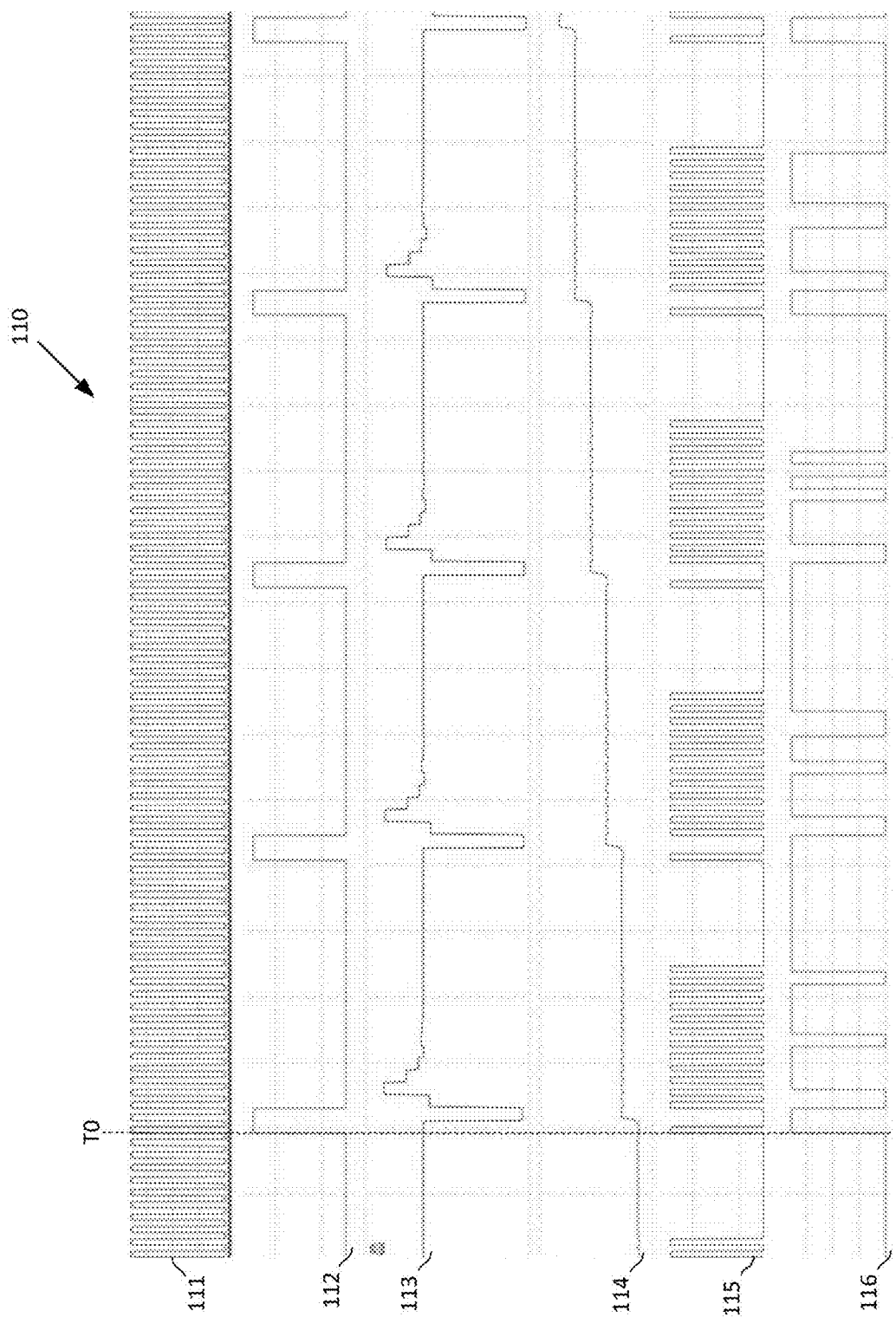
Figure 12:
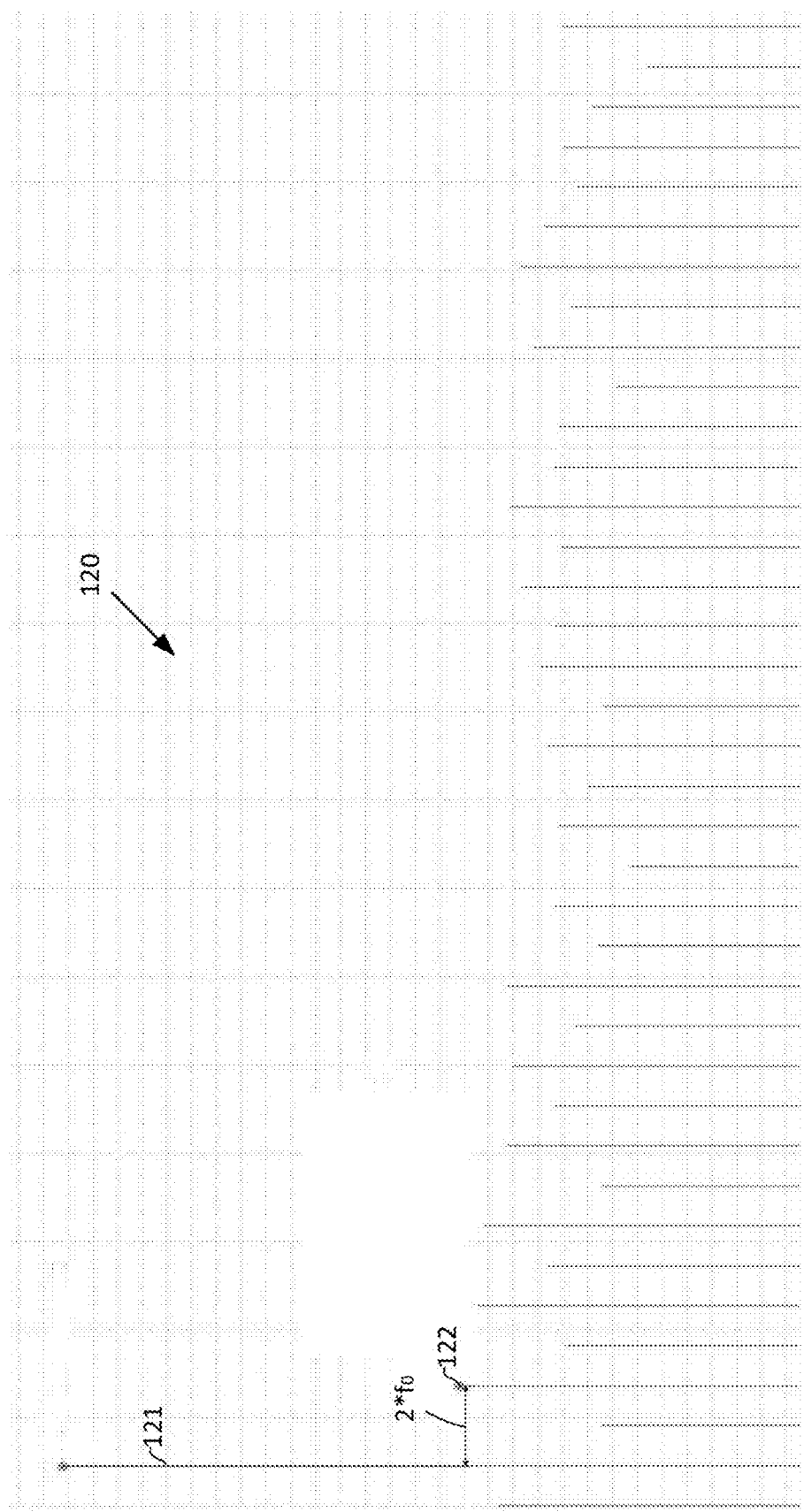

Referring now to FIGS. 10-12, example graphs illustrating operation and performance of SAR ADC 10 of FIG. 2 are shown, in accordance with an embodiment of the disclosure. The depicted waveforms are simulated waveforms from a design example of a 12-bit SAR ADC having background calibration as described above. In the particular design example, the charge pump active time $\Delta t$ is chosen such that:

$$\Delta t = \begin{cases} |FIR[D(n-N+1:n)]| - 0.5| > D_1: & \Delta T_{max} \\ |FIR[D(n-N+1:n)]| - 0.5| \in (D_2, D_1): & \Delta T_1 \\ |FIR[D(n-N+1:n)]| - 0.5| \in (D_3, D_2): & \Delta T_2 \\ |FIR[D(n-N+1:n)]| - 0.5| \leq D_3: & \Delta T_{min} \end{cases}$$

$D_1, D_2, D_3, \Delta T_{max}, \Delta T_1, \Delta T_2$ and $\Delta T_{min}$ are parameters to be optimized to minimize the initial transient time of calibration and ripple of the settled value of offset adjustment voltage $V_{os}$. In the waveforms depicted in FIG. 10, waveform 101 is a sinusoidal input signal provided to the SAR ADC and waveform 102 is the ADC output code sequence. Waveform 103 is the FIR-filtered output of the decision output of the comparator latch, waveform 104 is the charge pump active time adjustment code (control value $T_{ADJ}$) and waveform 105 is the calibrated offset adjustment voltage $V_{os}$. The maximum value of the charge pump active time $\Delta T_{max}$ is used, between times T1 and T2, to shorten the initial transient due to calibration. As the calibrated value of offset adjustment voltage $V_{os}$ converges to a target value, the charge pump active time adjustment code (control value $T_{ADJ}$) is reduced between time T2 and time T3 to decrease charge pump active time $\Delta t$ gradually, until after time T3 when the calibrated value of offset adjustment voltage $V_{os}$ has converged to the target value, the minimum charge pump active time adjustment code (control value $T_{ADJ}$) is used to reduce charge pump active time $\Delta t$ to $\Delta T_{min}$, thus the ripple of the settled value of offset adjustment voltage $V_{os}$ is minimized.

FIG. 11 illustrates further details of the calibration control of FIG. 10 during the initial transient of adjustment to the value of offset adjustment voltage $V_{os}$. Time T0 occurs at the end of a comparator auto-zero phase of one calibration cycle, when the comparator makes a calibration decision at the rising edge of the clock signal indicated by waveform 115. In the depicted example, the decision, shown as waveform 116, is a logical "1", and the charge pump charges the output capacitor(s) to an increased step in offset adjustment voltage $V_{os}$ voltage shown by waveform 114. Subsequently, the SAR ADC enters a successive approximation (evaluation) phase to convert the current sample. Subsequent intervals show pairs of calibration/evaluation phases, as offset adjustment voltage $V_{os}$ voltage increases as the calibration control loop converges. Waveform 111 is clock signal clk, waveform 112 is the calibration phase command signal, and waveform 113 is the SAR error, which approaches zero, illustrating the conversion evaluation successively approximating the target digital output code. FIG. 12 illustrates an FFT of the output of SAR ADC 10. Output distortion is dominated by the third harmonic 122, which is −80 dB below the level of the signal amplitude 121, which is sufficient for implementation of a 12-bit ADC.

In summary, this disclosure shows and describes circuits and integrated circuits implementing an on-line calibrated comparator, and their methods of operation. The systems include comprising an analog circuit and an analog signal comparator that compares outputs of the analog circuit. The analog signal comparator may include a preamplifier stage and a decision latch that samples an output of the preamplifier stage to generate an output state of the analog signal comparator. The systems also may include a switching circuit that selectively couples outputs of the analog circuit to inputs of the preamplifier stage of the analog signal comparator and a state control logic that alternatively operates the system in a first phase in which the analog circuit acquires an input signal and the analog signal comparator is being calibrated, and a second phase in which an output of the analog circuit is compared by the analog signal comparator. A sampling cycle may include operating the system in the first phase and then the second phase, wherein in the first phase, the state control logic controls the switching circuit to disconnect the outputs of the analog circuit from the inputs of the preamplifier stage of the analog signal comparator, and wherein the switching circuit applies a common mode reference to the inputs of the preamplifier stage of the analog signal comparator. The systems may also include an offset correction circuit that determines an offset correction change dependent on a history of states of an output of the decision latch of the analog signal comparator across multiple sampling cycles of the system. An output of the offset correction circuit may be coupled to an offset input of the decision latch of the analog signal comparator to adjust a threshold voltage of the decision latch in conformity with the history of the states of the output of the decision latch.

In some example embodiments, the offset correction circuit may determine the offset correction change by applying a non-equal weighting to multiple samples of the output of the decision latch. In some example embodiments, the offset correction circuit may apply a fast-Fourier analysis to the multiple samples of the sampling to determine the offset correction change. In some example embodiments, the system may be an analog-to-digital converter, wherein the first phase is a track/hold phase of the analog-to-digital converter, and wherein the second phase is a conversion phase of the analog-to-digital converter. In other example embodiments, the system may be a built-in-self-test (BIST) circuit within analog circuitry, wherein the first phase is a signal measurement phase of the BIST circuit, and wherein the second phase is an evaluation phase of the BIST circuit.

In some example embodiments, the offset correction circuit may include a charge pump that applies the offset correction change to a capacitor storing an offset value that is applied to the offset input of the decision latch. In some example embodiments, the charge pump may include a differential integrator, a pair of charging circuits that apply differential reference currents to inputs of the differential integrator with an alternating polarity, and control logic that controls a time of alternation of the polarity of the pair of charging circuits during the second phases of the state control logic, so that the differential integrator is charged in proportion to the determined offset correction change. In some example embodiments, an active time of the charge pump is varied in conformity with a magnitude of the offset correction change, so that a calibration time of the decision latch across multiple sampling cycles is reduced and residual ripple after calibration is reduced in magnitude.

In some example embodiments, the decision latch of the analog comparator may include a pair of cross-coupled latch stages for receiving a clock signal and capturing an output state of the decision latch in response to the clock signal, at least one tail device having an input for receiving the clock signal, a first pair of input ladder stages coupled between corresponding ones of the pair of cross-coupled latch stages and the at least one tail device for receiving the output of the preamplifier stage, whereby the cross-coupled latch stages capture a state determined by conduction of the first pair of input stages in response to the clock signal, and a second pair of input ladder stages coupled between corresponding ones of the pair of cross-coupled latch stages and the at least one tail device for receiving the output of the offset correction circuit, whereby the output of the offset correction circuit adjusts a threshold of the conduction of the first pair of input stages that determines the state captured by the cross-coupled latch stages. In some example embodiments, the clock signal may be a first clock signal, and the at least one tail device may include a first tail device coupled to the first pair of input ladder stages and that is controlled by the first clock signal, a second tail device coupled to the second pair of input ladder stages for receiving the second clock signal, and a variable delay circuit having an input coupled to the output of the offset correction circuit and an output providing the second clock signal to the second tail device, whereby the offset correction circuit varies a delay of the variable delay circuit according to the offset correction change. In some example embodiments, the system may further include a digital-to-analog converter having an input coupled to the output of the offset correction circuit for generating a differential offset voltage applied to inputs of the second pair of input ladder stages.

It should be understood, especially by those having ordinary skill in the art with the benefit of this disclosure, that the various operations described herein, particularly in connection with the figures, may be implemented by other circuitry or other hardware components. The order in which each operation of a given method is performed may be changed, and various elements of the systems illustrated herein may be added, reordered, combined, omitted, modified, etc. It is intended that this disclosure embrace all such modifications and changes and, accordingly, the above description should be regarded in an illustrative rather than a restrictive sense. Similarly, although this disclosure makes reference to specific embodiments, certain modifications and changes may be made to those embodiments without departing from the scope and coverage of this disclosure. Moreover, any benefits, advantages, or solutions to problems that are described herein with regard to specific embodiments are not intended to be construed as a critical, required, or essential feature or element.

While the disclosure has shown and described particular embodiments of the techniques disclosed herein, it will be understood by those skilled in the art that the foregoing and other changes in form, and details may be made therein without departing from the spirit and scope of the disclosure. For example, the techniques shown above may be applied to a signal comparator used in other operations, such as a signal detector.

What is claimed is:

1. A system, comprising:
   an analog circuit;
   an analog signal comparator that compares outputs of the analog circuit, the analog signal comparator comprising a preamplifier stage and a decision latch that samples an output of the preamplifier stage to generate an output state of the analog signal comparator;
   a switching circuit that selectively couples outputs of the analog circuit to inputs of the preamplifier stage of the analog signal comparator;
   a state control logic that alternatively operates the system in a first phase in which the analog circuit acquires an input signal and the analog signal comparator is being calibrated, and a second phase in which an output of the analog circuit is compared by the analog signal comparator, wherein a sampling cycle comprises operating the system in the first phase and then the second phase, wherein in the first phase, the state control logic controls the switching circuit to disconnect the outputs of the analog circuit from the inputs of the preamplifier stage of the analog signal comparator, and wherein the switching circuit applies a common mode reference to the inputs of the preamplifier stage of the analog signal comparator; and
   an offset correction circuit that determines an offset correction change dependent on a history of states of an output of the decision latch of the analog signal comparator across multiple sampling cycles of the system, wherein an output of the offset correction circuit is coupled to an offset input of the decision latch of the analog signal comparator to adjust a threshold voltage of the decision latch in conformity with the history of the states of the output of the decision latch.

2. The system of claim 1, wherein the offset correction circuit determines the offset correction change by applying a non-equal weighting to multiple samples of the output of the decision latch.

3. The system of claim 2, wherein the offset correction circuit applies a fast-Fourier analysis to the multiple samples of the sampling to determine the offset correction change.

4. The system of claim 1, wherein the system is an analog-to-digital converter, wherein the first phase is a track/hold phase of the analog-to-digital converter, and wherein the second phase is a conversion phase of the analog-to-digital converter.

5. The system of claim 1, wherein the system is a built-in-self-test (BIST) circuit within analog circuitry, wherein the first phase is a signal measurement phase of the BIST circuit, and wherein the second phase is an evaluation phase of the BIST circuit.

6. The system of claim 1, wherein the offset correction circuit comprises a charge pump that applies the offset correction change to a capacitor storing an offset value that is applied to the offset input of the decision latch.

7. The system of claim 6, wherein the charge pump comprises:
a differential integrator;
a pair of charging circuits that apply differential reference currents to inputs of the differential integrator with an alternating polarity; and
control logic that controls a time of alternation of the polarity of the pair of charging circuits during the second phases of the state control logic, so that the differential integrator is charged in proportion to the determined offset correction change.

8. The system of claim 6, wherein an active time of the charge pump is varied in conformity with a magnitude of the offset correction change, so that a calibration time of the decision latch across multiple sampling cycles is reduced and residual ripple after calibration is reduced in magnitude.

9. The system of claim 1, wherein the decision latch of the analog comparator comprises:
a pair of cross-coupled latch stages for receiving a clock signal and capturing an output state of the decision latch in response to the clock signal;
at least one tail device having an input for receiving the clock signal;
a first pair of input ladder stages coupled between corresponding ones of the pair of cross-coupled latch stages and the at least one tail device for receiving the output of the preamplifier stage, whereby the cross-coupled latch stages capture a state determined by conduction of the first pair of input stages in response to the clock signal; and
a second pair of input ladder stages coupled between corresponding ones of the pair of cross-coupled latch stages and the at least one tail device for receiving the output of the offset correction circuit, whereby the output of the offset correction circuit adjusts a threshold of the conduction of the first pair of input stages that determines the state captured by the cross-coupled latch stages.

10. The system of claim 9, wherein the clock signal is a first clock signal, and wherein the at least one tail device comprises:

a first tail device coupled to the first pair of input ladder stages and that is controlled by the first clock signal;
a second tail device coupled to the second pair of input ladder stages for receiving the second clock signal; and
a variable delay circuit having an input coupled to the output of the offset correction circuit and an output providing the second clock signal to the second tail device, whereby the offset correction circuit varies a delay of the variable delay circuit according to the offset correction change.

11. The system of claim 9, further comprising a digital-to-analog converter having an input coupled to the output of the offset correction circuit for generating a differential offset voltage applied to inputs of the second pair of input ladder stages.

12. A method of calibrating a system including an analog circuit and an analog signal comparator that compares outputs of an analog circuit, the method comprising:
alternatively operating the system in a first phase in which the analog circuit acquires an input signal and the analog signal comparator is being calibrated, and a second phase in which the outputs of the analog circuit are compared by the analog signal comparator, wherein a sampling cycle comprises operating the system in the first phase and then the second phase;
in the first phase, disconnecting the outputs of the analog circuit from inputs of a preamplifier stage of the analog signal comparator and applying a common mode reference to the inputs of the preamplifier stage of the analog signal comparator while sampling an output of the preamplifier stage of the analog signal comparator with a decision latch of the analog signal comparator;
determining an offset correction change dependent on a history of states of an output of the decision latch of the analog signal comparator across multiple sampling cycles of the system; and
applying the offset correction change to an offset input of the decision latch of the analog signal comparator to adjust a threshold voltage of the decision latch in conformity with the history of the states of the output of the decision latch.

13. The method of claim 12, wherein the determining an offset correction change combines multiple samples of the sampling with a non-equal weighting.

14. The method of claim 13, wherein the determining an offset correction change performs a fast-Fourier analysis of the multiple samples of the sampling to determine the offset correction change.

15. The method of claim 12, wherein the system is an analog-to-digital converter, wherein the first phase is a track/hold phase of the analog-to-digital converter, and wherein the second phase is a conversion phase of the analog-to-digital converter.

16. The method of claim 12, wherein the system is a built-in-self-test (BIST) circuit within analog circuitry, wherein the first phase is a signal measurement phase of the BIST circuit, and wherein the second phase is an evaluation phase of the BIST circuit.

17. The method of claim 12, wherein the applying the offset correction change comprises applying charge to or removing charge from a capacitor storing an offset value that is applied to the offset input of the decision latch.

18. The method of claim 17, wherein the applying charge to or removing charge from the capacitor comprises:
accepting or providing the charge at inputs of a differential integrator by reference currents with an alternating polarity; and controlling a time of alternation of the polarity of the reference currents during the second phases of the system, so that the differential integrator is charged in proportion to the determined offset correction change.

19. The method of claim 17, wherein an active time of the applying or removing charge is varied in conformity with a magnitude of the offset correction change, so that a calibration time of the decision latch across multiple sampling cycles is reduced and residual ripple after calibration is reduced in magnitude.

20. The method of claim 12, wherein the decision latch of the analog comparator comprises a pair of cross-coupled latch stages for receiving a clock signal and capturing an output state of the decision latch in response to the clock signal, at least one tail device having an input for receiving the clock signal a first pair of input ladder stages coupled between corresponding ones of the pair of cross-coupled latch stages and the at least one tail device for receiving the output of the preamplifier stage, whereby the cross-coupled latch stages capture a state determined by conduction of the first pair of input stages in response to the clock signal, and a second pair of input ladder stages coupled between corresponding ones of the pair of cross-coupled latch stages and the at least one tail device, and wherein the applying the offset correction change adjusts input voltages of the second pair of input ladder stages to adjust a threshold of the conduction of the first pair of input stages that determines the state captured by the cross-coupled latch stages.

21. The method of claim 20, wherein the clock signal is a first clock signal, wherein the at least one tail device comprises a first tail device coupled to the first pair of input ladder stages and that is controlled by the first clock signal and a second tail device coupled to the second pair of input ladder stages for receiving the second clock signal, and wherein the applying the correction adjusts a variable delay of the second clock signal with respect to the first clock signal.

22. The method of claim 20, wherein the applying the correction comprises converting a digital offset correction change to a differential analog offset voltage with a digital-to-analog converter, and applying the differential analog offset voltage to inputs of the second pair of input ladder stages.

\* \* \* \* \*